(12) United States Patent
Tailliet et al.

(10) Patent No.: US 10,558,609 B2
(45) Date of Patent: Feb. 11, 2020

(54) APPARATUS FOR INTER-INTEGRATED CIRCUIT (I2C) CLOCK TRANSMISSION CHANNEL WHEREIN EACH FILTERING MODULES COOPERATES WITH THE RESISTIVE CIRCUIT

(71) Applicant: STMicroelectronics (Rousset) SAS, Rousset (FR)

(72) Inventors: François Tailliet, Fuveau (FR); Chama Ameziane El Hassani, Aix en Provence (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/204,660

(22) Filed: Nov. 29, 2018

(65) Prior Publication Data

US 2019/0188179 A1 Jun. 20, 2019

(30) Foreign Application Priority Data

Dec. 14, 2017 (FR) ..................................... 17 62143

(51) Int. Cl.
*G06F 13/00* (2006.01)
*G06F 13/42* (2006.01)

(52) U.S. Cl.
CPC .. *G06F 13/4282* (2013.01); *G06F 2213/0016* (2013.01)

(58) Field of Classification Search
CPC ..................... G06F 13/4282; G06F 2213/0016
See application file for complete search history.

(56) References Cited

U.S. PATENT DOCUMENTS

| 7,411,427 B1 | 8/2008 | Fong | |
| 8,948,209 B2* | 2/2015 | Tailliet | G06F 13/4291 370/352 |
| 9,753,886 B2* | 9/2017 | Tailliet | G06F 13/4291 |
| 2002/0113643 A1 | 8/2002 | La Rosa | |
| 2005/0122152 A1 | 6/2005 | Yoshida et al. | |
| 2008/0177918 A1* | 7/2008 | Lee | G06F 13/4291 710/110 |

OTHER PUBLICATIONS

NXP Semiconductors, UM 10204, "I2C-bus specification and user manual", Rev. Apr. 4-6, 2014, 64 pages.

* cited by examiner

*Primary Examiner* — Tammara R Peyton
(74) *Attorney, Agent, or Firm* — Slater Matsil, LLP (57) ABSTRACT

In an embodiment, an electronic device for filtering an incoming digital signal includes several elementary filtering modules that include an elementary input configured to receive an incident elementary signal extracted from an incoming signal, an elementary output, and a dedicated capacitive circuit. The device further includes a resistive circuit common to all the elementary filtering modules and configured for cooperating with the capacitive circuit of each elementary filtering module in such a manner as to filter, on the respective elementary output, pulses of the incident elementary signal having a first voltage level and a duration less than a time constant and to deliver a filtered elementary signal on the elementary output.

20 Claims, 6 Drawing Sheets

APPARATUS FOR INTER-INTEGRATED CIRCUIT (I2C) CLOCK TRANSMISSION CHANNEL WHEREIN EACH FILTERING MODULES COOPERATES WITH THE RESISTIVE CIRCUIT

CROSS-REFERENCE TO RELATED APPLICATIONS

This application claims the benefit of French Application No. 1762143, filed on Dec. 14, 2017, which application is hereby incorporated herein by reference.

TECHNICAL FIELD

The present invention relates generally to an electronic system and method, and, in particular embodiments, to an apparatus for filtering signals.

BACKGROUND

The inter-integrated-circuit ($I^2C$) bus is a well-known standard for inter-integrated-circuit communications.

Figure 1:
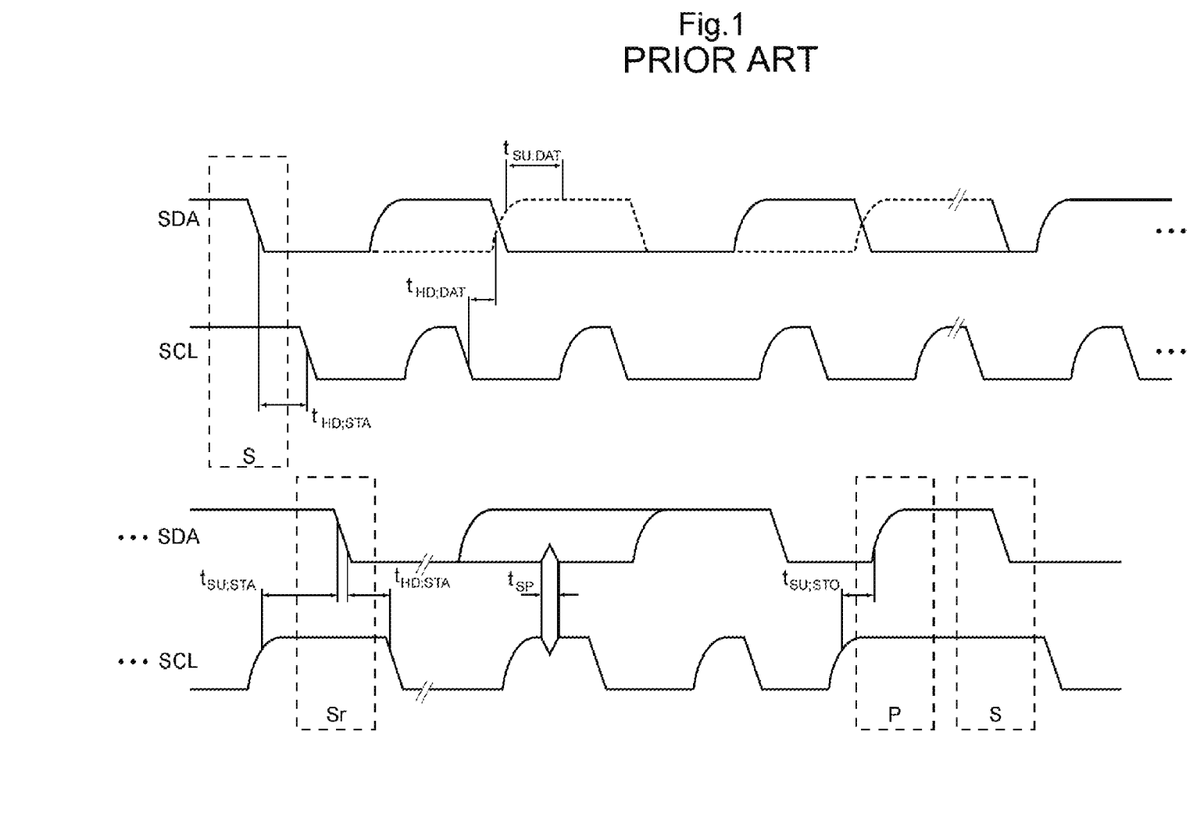
FIG. 1, previously described, illustrates signals from one example of a communication carried out over an I²C bus.

FIG. 1 shows signals from one example of a communication carried out over an I2C bus.

The $I^2C$ bus comprises two channels, an SDA serial data channel and an SCL serial clock channel, which transmit information between the devices connected to the $I^2C$ bus.

The SCL clock channel is a unidirectional line which transmits a clock signal SCL generated by a master device.

The SDA data channel is a bidirectional line which transmits SDA data signals to be communicated over the $I^2C$ bus.

The digital clock signal SCL and data signal SDA are composed of voltage signals that can have a HIGH level or a LOW level.

During a transmission of data, the signal on the SDA line must be stable during the HIGH period of the clock signal. The HIGH or LOW state of the data line SDA can only change when the clock signal on the SCL line is LOW. Generally, the HIGH and LOW levels of the data signal SDA respectively represent the logical values "1" and "0."

All the transactions begin with a start condition "START" S or repeated start condition Sr and finish with an end condition "STOP" P. A start condition S/Sr is defined by a falling edge (i.e., a HIGH to LOW transition) on the SDA line while the state on the SCL line is HIGH. An end condition P is defined by a rising edge (i.e., a LOW to HIGH transition) on the SDA line while the state of the SCL line is HIGH.

The $I^2C$ specification (reference may be made to the document UM10204 version 6.0 of Apr. 4, 2014) recommends the application of a low-pass filter on the incoming data signals SDA and clock signals SCL, in order to eliminate spurious pulses of width $t_{SP}$ less than, for example, 200 ns, preferably less than 50 ns.

The $I^2C$ specification also recommends the compliance with a set-up time $t_{SU}$ and a hold time $t_{HD}$ on the transitions of the data signal SDA, with respect to the transitions of the clock signal SCL, in such a manner as to keep the transitions of the data signal SDA away from the transitions of the clock signal SCL.

This avoids, for example, a transition of the signal SDA close to a transition of the signal SCL generating a spurious start or end condition.

Thus, there exist minimum durations to comply with between the transitions of the data signal SDA and the transitions of the clock signal SCL. In particular, a start condition set-up time $t_{SU;STA}$ between a rising edge of the signal SCL and the start condition falling edge of the signal SDA; a start condition hold time $t_{HD;STA}$ between the start condition falling edge of the signal SDA and the respective falling edge of the signal SCL; a data set-up time $t_{SU;DAT}$ between a transition of the signal SDA and the rising edge of the signal SCL; a data hold time $t_{HD;DAT}$ between a falling edge of the signal SCL and a falling edge of the signal SDA; and an end condition set-up time $t_{SU;STO}$ between a rising edge of the signal SCL and the end condition rising edge of the signal SDA.

The values of these durations depend notably on the communication frequency established over the $I^2C$ bus.

Thus, when received, filters are implemented on the incoming signals SDA and SCL in order to only consider their transitions in accordance with the specified set-up time and hold time.

In general, these filters on the incoming signals SDA and SCL are implemented with RC filter circuits of the first order.

Typically, the elimination of the spurious positive and negative pulses on each of the two signals uses four RC filter circuits. The verification of the compliance with the set-up time and with the hold time typically uses three RC filter circuits. As a consequence, seven RC filter circuits are typically implemented for the processing of the incoming data signal SDA and of the incoming clock signal SCL.

This type of conventional configuration has the drawback of being very bulky, notably owing to the resistors of the RC filter circuits, of the order of 100 kΩ, which must be formed in width for reasons of stability of characteristics from one fabrication to another.

The developments of fabrication technologies do not allow the size of the resistive elements to be significantly reduced.

As a consequence, the share of the RC filters within the overall surface of the integrated circuits is increasing over time, and can currently, for example, exceed 5% of the surface area of silicon in a 16 Kbit EEPROM memory.

Each RC filter circuit consumes a current specific to it, due to the successive charging and discharging of the capacitor of the filter, through the resistor of the filter. The conventional configurations thus consume a non-negligible amount of current.

Furthermore, in the conventional configurations, the filtering properties of the various RC filter circuits may be subject to relative variations between them, notably owing to the fabrication tolerances and process variations, and this can falsify the reading of the conditions to be detected.

There accordingly exists a need to overcome the various drawbacks of the conventional configurations.

SUMMARY

Various embodiments of the invention and their implementation relate to the filtering of signals. Particular embodiments relate to filtering of incoming signals from an $I^2C$ bus.

In some embodiments, an electronic device is provided for filtering at least one incoming digital signal, comprising at least a first input intended to receive the at least one incoming signal, several elementary filtering modules each comprising an elementary input intended to receive an incident elementary signal extracted from the incoming signal, an elementary output and a dedicated capacitive circuit, the elementary filtering modules being directly or indirectly coupled to the first input. The device furthermore comprises a resistive circuit common to all the elementary filtering modules and configured for cooperating with the capacitive circuit of each elementary filtering module in such a manner that each elementary filtering module can filter pulses from the corresponding incident elementary signal having a first voltage level and a duration less than a time constant and deliver a filtered elementary signal on the corresponding elementary output.

The electronic filtering device thus allows the resistive circuit to be shared for implementing independent elementary filtering of the resistive-capacitive type, each elementary filtering resulting from the cooperation between the common resistive circuit and the capacitive circuit contained in the corresponding elementary filtering module. This notably results in a gain in space, a saving in current and a homogenization of the behaviours of the elementary filtering (in other words a reduction in their relative variations).

Furthermore, the elementary filtering modules act on a first type of pulses of the incident signal, notably avoiding variations in behaviour of the elementary filters on one type of edge with respect to another type of edge. These variations may, for example, come from the difference in behaviours between the complementary technologies each processing a respective type of edge.

Depending on the arrangement of the elementary filtering modules within the device, an incident elementary signal extracted from the incoming signal may, for example, be the incoming signal itself or else a filtered elementary signal delivered by another elementary filtering module, itself coupled, directly or indirectly, to the first input.

According to one embodiment, each elementary filtering module comprises a buffer circuit configured for generating a control signal said to be enabled, in the presence of the incident elementary signal having the first voltage level. The resistive circuit comprises a resistive element and is configured for generating a first current in the resistive element in the presence of at least one enabled control signal. A current mirror circuit is configured between the resistive circuit and the capacitive circuit of each elementary filtering module and is configured for generating a second current starting from the first current. The capacitive circuit of each elementary filtering module comprises a capacitive element and is configured for charging the capacitive element with the second current. The buffer circuit of each elementary filtering module is configured for delivering the filtered elementary signal set at a first voltage level when the voltage across the terminals of the capacitive element reaches a threshold value.

Thus, the shared current is generated on command conditioned to the requirement of the elementary filtering modules, reducing the overall energy consumption.

According to one embodiment, each capacitive circuit and the corresponding current mirror circuit are configured so that the voltage across the terminals of the capacitive element reaches the threshold value in a time equal to the time constant.

For example, the current mirror circuit can have a gain of less than 1, in which case the size of the capacitive element can be minimized, and the second current consumed by each elementary filtering module is limited in intensity.

According to one embodiment, each buffer circuit is configured, in the presence of an incident elementary signal having a second voltage level, for delivering the filtered elementary signal reset to the second voltage level.

According to one embodiment, the resistive circuit comprises a switching element configured, in the presence of at least one enabled control signal, for connecting the two terminals of the resistive element to two nodes having a difference in potential equal to the threshold value, in such a manner as to generate the first current.

Advantageously, each buffer circuit comprises an inverter-trigger circuit having a trigger threshold equal to the threshold value, controlled by the voltage across the terminals of the capacitive element, and configured for controlling the delivery of the filtered elementary signal set at the first voltage level.

The cooperation between the resistive circuit and each buffer circuit according to this embodiment has the advantage, on top of the generation of the first current being simple and with immediate effect, of implementing elementary filtering whose time constants are not affected by the effective value of the power supply voltage.

According to one embodiment, the device comprises a low-pass filtering stage comprising a first elementary filtering module and a second elementary filtering module configured in parallel, the elementary input of the first elementary filtering module being connected to the first input, the elementary input of the second elementary filtering module being coupled to the first input via an inverter, the low-pass filtering stage further comprising a latch, having a set input connected to the elementary output of the first elementary filtering module, a reset input connected to the elementary output of the second elementary filtering module, and an output intended to deliver a filtered outgoing signal having the first voltage level if the first voltage level is applied to the set input and the second voltage level if the first voltage level is applied to the reset input.

This notably allows standardized conditions to be satisfied.

According to one embodiment, the device comprises a first delay stage comprising a third elementary filtering module and a fourth elementary filtering module configured in series, the elementary input of the fourth elementary filtering module being coupled to the elementary output of the third elementary filtering module via an inverter, the first delay stage comprising an inverter connected to the output of the fourth elementary filtering module and designed to deliver a delayed outgoing signal.

According to one embodiment, the device further comprises a second delay stage comprising a fifth elementary filtering module, whose time constant is greater than the time constant of the third elementary filtering module, designed to deliver a delayed outgoing signal.

This notably allows standardized conditions to be satisfied.

According to one embodiment, the device further comprises a second input to which at least one of the elementary filtering modules is coupled and intended to receive another incoming digital signal.

An integrated circuit, such as a non-volatile memory, is also provided that is designed to communicate over an I$^2$C bus comprising a transmission channel for a clock signal and a transmission channel for a data signal, comprising such a device whose first input is intended to be connected to the transmission channel for the clock signal and whose second input is intended to be connected to the transmission channel for the data signal.

BRIEF DESCRIPTION OF THE DRAWINGS

Other advantages and features of the invention will become apparent upon examining the detailed description of embodiments, which are in no way limiting, and from the appended drawings in which:|

DETAILED DESCRIPTION OF ILLUSTRATIVE EMBODIMENTS

Figure 2:
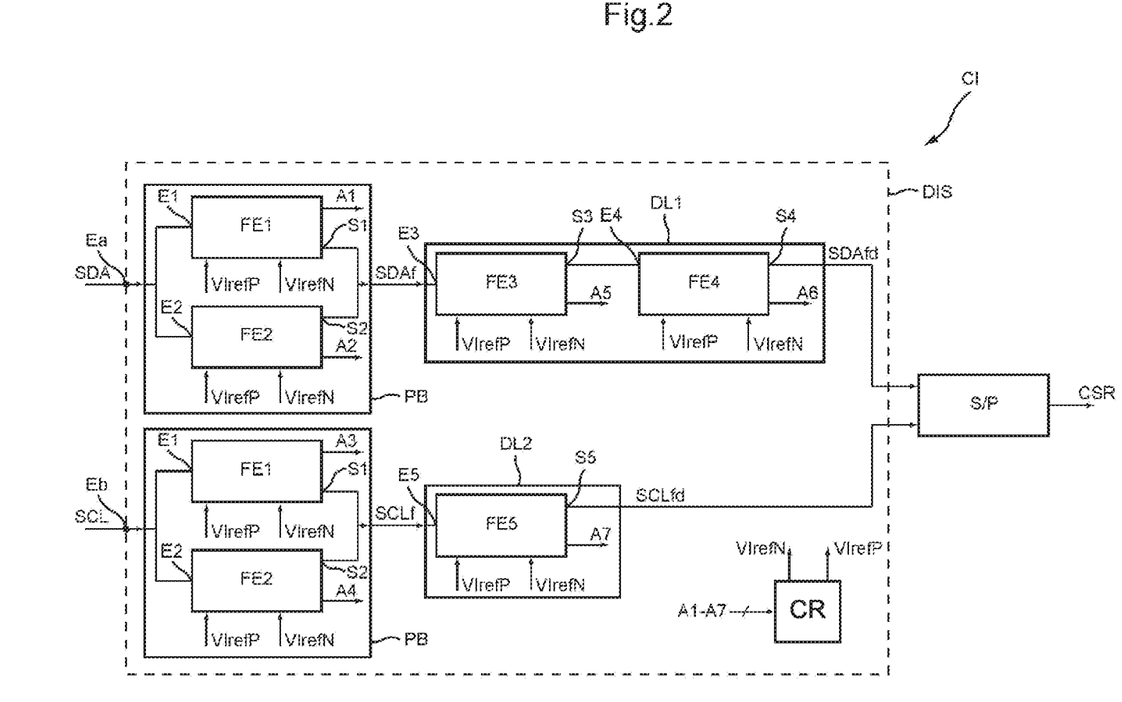
FIGS. 2 to 6 show examples of embodiments of the invention.

FIG. 2 shows an embodiment of an integrated circuit CI such as a non-volatile memory.

The integrated circuit CI is designed to communicate over an I²C bus comprising a transmission channel for a clock signal SCL and a transmission channel for a data signal SDA, comprising an electronic filtering device DIS, a first input Ea of which is intended to be connected to the transmission channel for the data signal SDA and a second input Eb of which is intended to be connected to the transmission channel for the clock signal SCL.

The electronic filtering device DIS is, for example, dedicated to correspond to recommendations of the I²C specification previously introduced.

The device DIS comprises several elementary filtering modules FEi (e.g., i∈{1; 2; 3; 4; 5}) for the incoming data signal SDA and the incoming clock signal SCL.

In this embodiment, the data signal SDA and the clock signal SCL are each applied to the input of a respective low-pass filtering stage PB.

Each low-pass filtering stage PB comprises two elementary filtering modules FE1, FE2 in a parallel configuration, configured for filtering spurious pulses potentially present on the respective signals.

Each low-pass filtering stage PB respectively delivers a filtered data signal SDAf and a filtered clock signal SCLf.

The filtered data signal SDAf is applied to the input of a first stage DL1 for delaying by a first time period (t1), comprising a third elementary filtering module FE3 and a fourth elementary filtering module FE4 in a series configuration, configured for introducing a delay of the first time period (t1) on the rising edges and on the falling edges of the filtered data signal SDAf.

The filtered clock signal SCLf is applied to the input of a second time stage DL2 for delaying by a second time period (t2), comprising a fifth elementary filtering module FE5, configured for introducing a delay of the second time period (t2) on the rising edges of the filtered clock signal SDAf.

The first time delay stage DL1 and the second time delay stage DL2 respectively deliver a filtered and delayed data signal SDAfd and a filtered and delayed clock signal SCLfd.

The filtered and delayed data signal SDAfd and the filtered and delayed clock signal SCLfd are subsequently transmitted to an I²C bus decoding stage, for example an S/P stage for detection of start (S) and end (P) conditions communicating a status to a CSR (Chip Select Register).

Each elementary filtering module FE cooperates with a single resistive circuit CR of the device DIS.

Each elementary filtering module FE is configured for generating a respective control signal Ai, whose enabled or disabled state controls the resistive circuit CR.

The resistive circuit CR is configured for immediately generating a first current ($i_r$) in response to an enabling of at least one of the control signals Ai. The term "immediately" is understood to correspond to the minimum duration allowed by the technology of the integrated circuit CI, in other words of the order of the switching time of an MOS transistor.

The resistive circuit CR distributes, to all the elementary filtering modules FE, a first reference control voltage VIrefP representative of the first current ($i_r$) and a second reference control voltage VIrefN.

Figure 3:
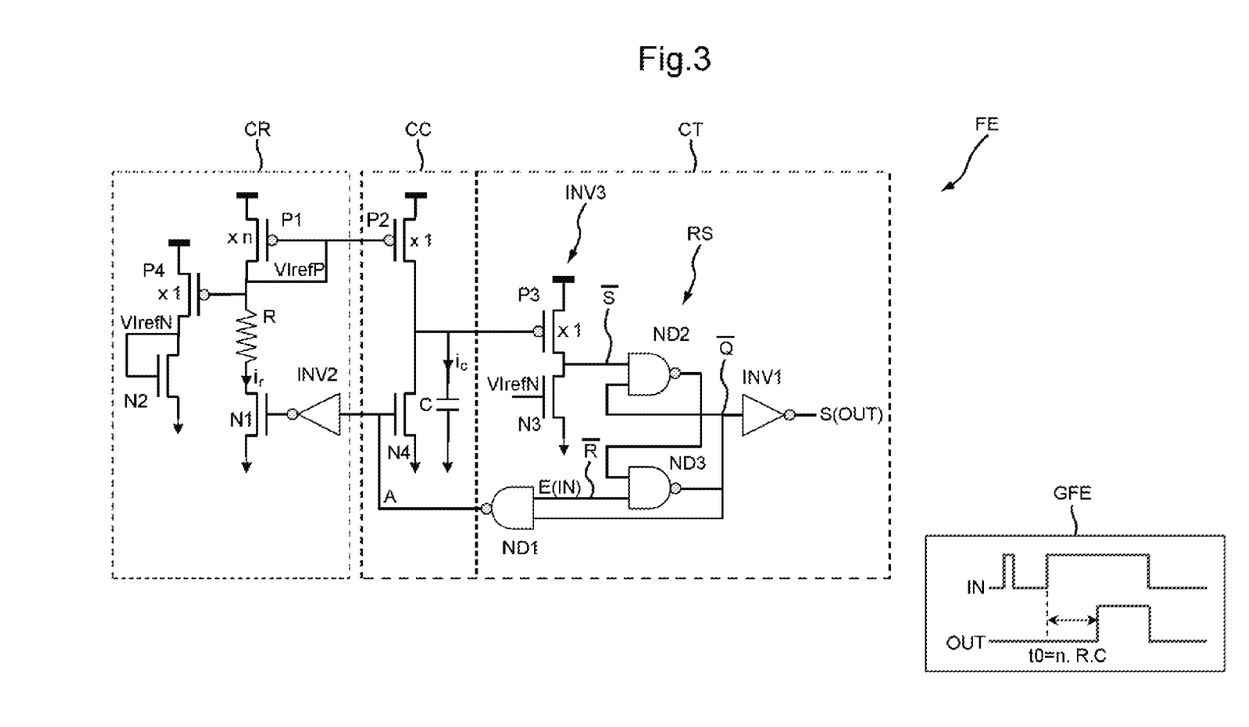

FIG. 3 shows one exemplary embodiment of an elementary filtering module FE, on its own.

In this example and hereinafter, a "first type of edge" corresponds to a rising edge, a "second type of edge" corresponds to a falling edge, a "first voltage level" corresponds to a "high" level, in other words a logical "1," and a "second voltage level" corresponds to a "low" level, in other words a logical "0."

The elementary filtering module FE comprises an elementary input E, a capacitive circuit CC, a buffer circuit CT, a resistive circuit CR, and an elementary output S.

The input E receives an elementary incident signal IN and the output S delivers an outgoing signal OUT, resulting from an elementary filtering of the incident signal IN.

The elementary filtering module FE comprises a buffer circuit CT configured for generating a control signal A said to be enabled, in the presence of the incident elementary signal IN having the first voltage level. More precisely, the control signal A is enabled when the incident elementary signal IN has the first voltage level, and when the elementary output signal OUT has the second voltage level on the output S. In other words, if IN=1 and OUT=1, then the control signal A is disabled.

The resistive circuit CR comprises a resistive element R and is configured for generating a first current $i_r$ in the resistive element R in the presence of at least one enabled control signal A (Ai).

A current mirror circuit is arranged between the resistive circuit CR and the capacitive circuit CC and is configured for generating a second current $i_c$ starting from the first current $i_r$.

The capacitive circuit CC comprises a capacitive element C and is configured for charging the capacitive element C with the second current $i_c$.

The buffer circuit CT is furthermore configured for delivering the filtered elementary signal OUT set at a first voltage level when the voltage across the terminals of the capacitive element C reaches a threshold value VIrefP.

The charging of the capacitive element C leads to the generation of a voltage ramp across the terminals of the capacitive element.

Thus, the buffer circuit CT is configured for delivering, on the output S, an output signal OUT set at a first logical level when the voltage ramp reaches a threshold value (equivalent to the value Vdd−VthP).

Indeed, the buffer circuit CT comprises an inverter-trigger circuit INV3 having a trigger threshold equal to the threshold value VIrefP, controlled by the voltage across the terminals of the capacitive element C, and configured for controlling the delivery of the filtered elementary signal OUT set at the first voltage level.

The inverter-trigger circuit INV3 comprises a PMOS trigger transistor P3 connected between a power supply terminal and the set inverse input $\overline{S}$ of the latch RS, whose gate is controlled by the voltage ramp and having a threshold voltage equal to the threshold value.

The inverter-trigger circuit INV3 also comprises an NMOS trigger transistor N3, controlled by a second reference control voltage VIrefN, and connected in series with the PMOS trigger transistor P3, between the set inverse input $\overline{S}$ and a ground terminal.

In this embodiment, the latch RS is constructed using two NAND gates ND2, ND3, and a first inverter INV1. The latch RS comprises a set inverse input $\overline{S}$ and a reset inverse input $\overline{R}$ and is configured for delivering an inverse output $\overline{Q}$ at the input of the first inverter INV1 whose output forms the output S of the elementary filtering module FE.

The latch RS operates conventionally in the following manner: if $\overline{S}$ (set) is set to 0, the output $\overline{Q}$ goes to 0; if $\overline{R}$ (reset) is set to 0, the output $\overline{Q}$ goes to 1; if $\overline{R}=\overline{S}=1$, the output $\overline{Q}$ holds its preceding value.

The incident elementary signal IN on the input E of the elementary filtering module FE is applied to the reset inverse input $\overline{R}$ of the latch RS, thus, each falling edge of the incident signal IN introduces an immediate transition of the output $\overline{Q}$ of the latch RS to 1, and therefore an immediate transition of the outgoing signal OUT to 0, via the first inverter INV1.

In other words, the buffer circuit CT is configured, in the presence of an incident elementary signal IN having a second voltage level, for delivering the filtered elementary signal OUT reset to the second voltage level.

A NAND gate ND1 receiving at the input the incident signal IN and the inverse output signal $\overline{Q}$ of the latch RS of the buffer circuit CT, delivers a control signal A, distributed to the capacitive circuit CC and to the resistive circuit CR.

In the capacitive circuit CC, the control signal A is applied to the gate of an NMOS discharge switching transistor N4, configured for coupling a first electrode of a capacitor C to a ground terminal when it is controlled to be conducting.

The second electrode of the capacitor C is coupled to a ground terminal.

The first electrode is coupled to the gate of the PMOS trigger transistor P3 of the inverter-trigger circuit INV3 of the buffer circuit CT.

Furthermore, the first electrode of the capacitor C is coupled to a conduction terminal of a PMOS current copying transistor P2, controlled by a first reference control voltage VIrefP, generated and distributed by the resistive circuit CR. The first electrode is intended to be charged by a second current $i_c$ coming from the current copying transistor P2.

In the resistive circuit CR, the control signal A is applied as an input of a second inverter INV2.

The inverted control signal A controls an NMOS switching transistor N1, coupled between a terminal of a resistive element R and a ground terminal.

The resistive element R is furthermore coupled to a power supply voltage terminal via a PMOS transistor configured as a diode P1.

The PMOS transistor configured as a diode P1 forms a gauge element designed to generate a first reference control voltage VIrefP on its gate and its drain when a current flows in the resistive element R.

In the resistive circuit, the first reference control voltage VIrefP is obtained by the gate voltage of the PMOS transistor configured as a diode P1.

The first reference control voltage VIrefP also controls a PMOS transistor P4 coupled between a power supply terminal and an NMOS transistor configured as a diode N2, connected between the transistor P4 and a ground terminal.

The NMOS transistor configured as a diode N2 also forms a gauge element designed to generate a second reference control voltage VIrefN close to its threshold voltage on its gate and its drain when a current flows in the resistive element R.

The second reference control voltage VIrefN is obtained by the gate voltage of the NMOS transistor configured as a diode N2.

The NMOS trigger transistor N3 and the NMOS transistor configured as a diode N2 are matched, in other words they are formed in the course of the same fabrication steps and according to the same characteristics, and thus exhibit a similar behaviour, notably as regards the effective value of threshold voltage.

The transistors PMOS P1, P2, P3, P4 are also matched. The PMOS transistor configured as a diode P1 nevertheless has a size factor "n," in other words, it exhibits an output characteristic ($i_D/v_{GS}$) n-proportional to the output characteristic of the other PMOS transistors P1, P3, and P4 (which have a unitary size factor in this embodiment). This is, for example, obtained by formation of n transistors with unitary size factors connected in parallel in order to form the transistor P2.

In operation, as previously described, the elementary filtering module FE immediately transmits a falling edge of the incident signal IN onto the outgoing signal OUT.

The control signal A at "1" makes the discharge transistor N4 conduct, coupling the first electrode of the capacitive element to ground. As a consequence, the PMOS trigger transistor P3 is conducting and transmits a high voltage level onto the set inverse input $\overline{S}=1$.

Starting from such a state, IN=0, $\overline{Q}$=1, OUT=0, upon a rising edge of the incident signal IN, IN=1, the control signal A goes to "0" at the output of the NAND gate ND1.

In some embodiments, the control signal A is said to be enabled when it is at the logical value "0" and disabled at the logical value "1."

The NMOS switching transistor N1 is conducting, coupling one terminal of the resistive element R to ground. The other terminal of the resistive element R is biased at the first reference control voltage VIrefP, close to the power supply voltage Vdd decreased by the threshold voltage VthP of the PMOS transistor configured as a diode P1.

The potential difference across the terminals of the resistive element R generates the flow of the first current $i_r$, such that $i_r$=(Vdd−VthP)/R.

Furthermore, since the control signal A is enabled (e.g., at "0"), the NMOS discharge transistor N4 is turned off and ceases to discharge the capacitive element C. The PMOS trigger transistor P3 remains conducting.

The PMOS transistor P4 is driven into a saturated operational mode by the first reference voltage VIrefP and biases the gate of the NMOS transistor configured as a diode N2 exactly at the threshold voltage (VIrefN) of the transistor N2.

The PMOS current copying transistor P2 is controlled by the first reference voltage VIrefP=Vdd−VthP and thus allows a second current $i_c$ to flow charging the capacitive element C, with $i_c$=(Vdd−VthP)/nR.

Thus, the charging of the capacitive element C, $dV/dt=i_C/C$, generates a voltage ramp across its terminals such that $V(t)=i_c \times t/C$.

In other words, the resistive circuit CR is configured so that an enabled control signal A immediately drives the generation of the first current $i_r$, and the capacitive circuit CC is configured for generating the voltage ramp if the control signal A is enabled.

Given that the trigger transistor P3 and the transistor P4 are matched to one another, and to the transistor P1, and that the transistor N3 is matched to the transistor N2, at the point of switching of the inverter-trigger circuit INV3, since the trigger transistor P3 has the same drain current as the transistor P4 by copying of the drain current of the transistor P4 via the transistors N2 and N3, the gate voltage of the trigger transistor P3 is identical to the gate voltage VIrefP of the transistor P4.

Thus, the inverter-trigger circuit INV3 will switch when the voltage ramp reaches the threshold value (Vdd−VthP), in other words after a time t0 (also referred to as time constant t0 or elementary time period t0) has passed, such that $V(t0)=i_c \times t0/C=Vdd-VthP$.

However, $i_c \times t0/C=((Vdd-VthP)/nR) \times t0/C=Vdd-VthP$, which gives $t0=nRC$.

Thus, to a first order, the value of the time constant t0 is independent of the power supply voltage.

The PMOS trigger transistor P3 turns off, the inverter-trigger circuit INV3 switches, the set inverse input $\overline{S}$ goes to 0, and the latch RS delivers, via the first inverter INV1, an output signal OUT at 0, with a delay of the elementary time period t0 with respect to the rising edge of the incident signal IN.

In some embodiments, the elementary filtering module FE, the resistive circuit CR is configured for generating the first current $i_r$ in response to the first type of edge of the incident signal IN on the elementary input E. The capacitive circuit CC is configured for generating a voltage ramp from the second current $i_c$ coming from the first current $i_r$. The buffer circuit CT is configured for delivering on the output S an output signal OUT set at the first logical level when the voltage ramp reaches a threshold value V(t0)=VIrefP, and, in response to a second type of edge of the incident signal IN on the input E, for delivering, on the output S, an output signal OUT immediately reset to a second logical level.

As shown by the graph GFE of FIG. 3, the outgoing signal OUT corresponds to the incident signal IN whose rising edges are delayed by an elementary time period t0, and whose falling edges are not delayed.

Furthermore, since the incident signal IN is held at the first voltage level ("high" level here) for the voltage ramp to reach the threshold value (i.e., held for the period t0), the positive pulses shorter than the elementary time period t0 are not transmitted on the outgoing signal OUT, the latch RS then providing its memory function.

In some embodiments, an elementary filtering module FE filters the positive pulses with a duration shorter than the elementary time period t0 and introduces a delay of one elementary time period t0 onto the rising edges.

Figure 4:
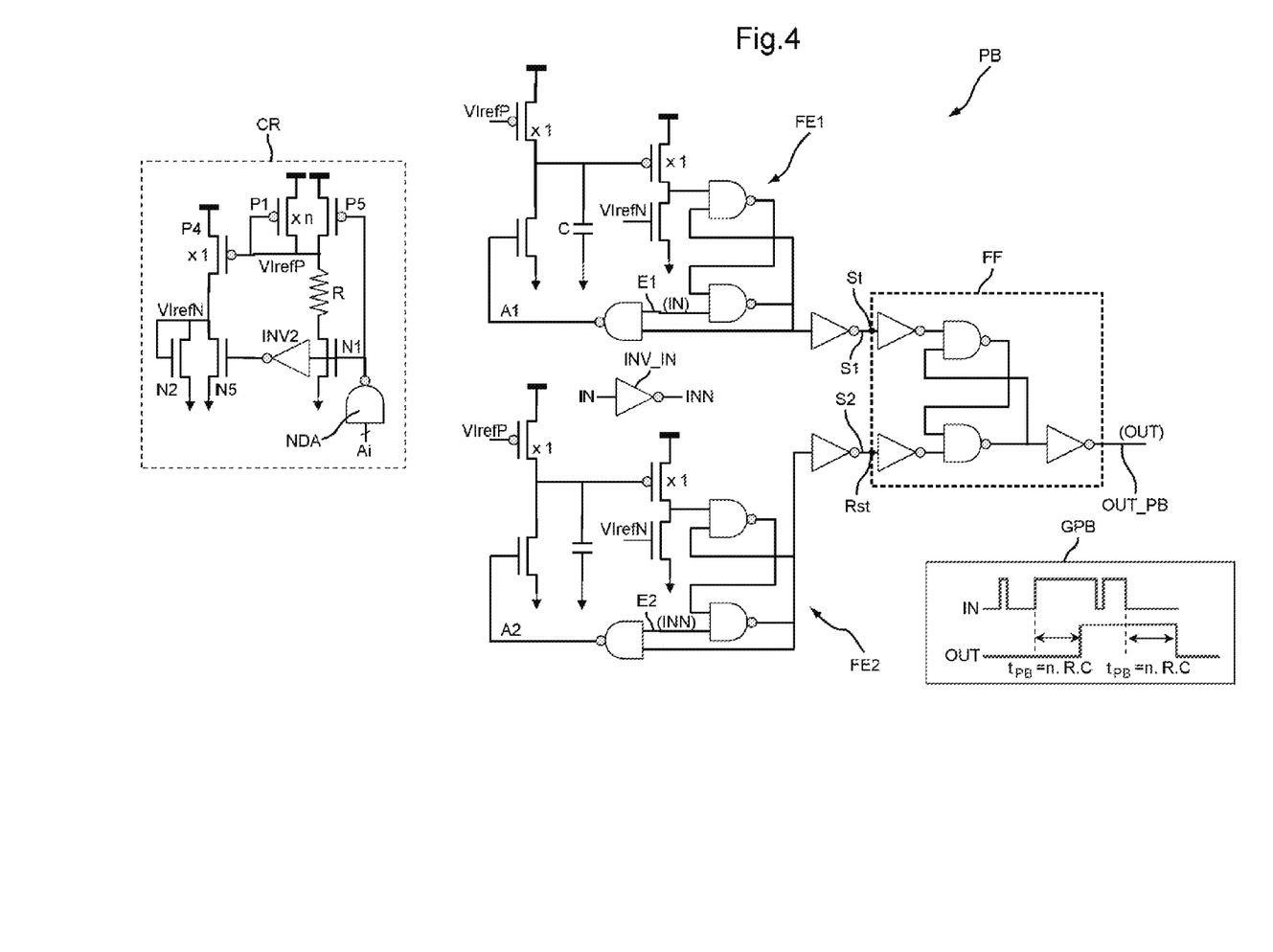
Figure 5:
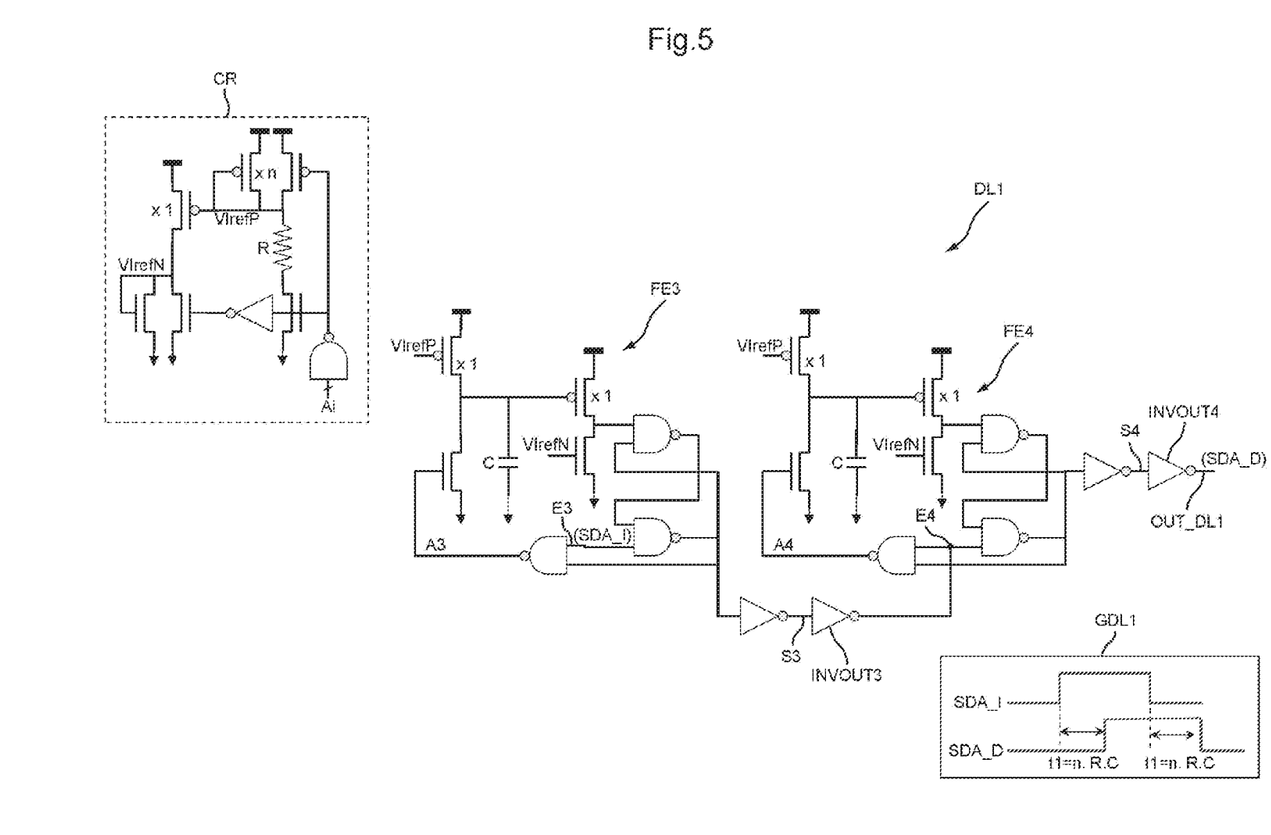
Figure 6:
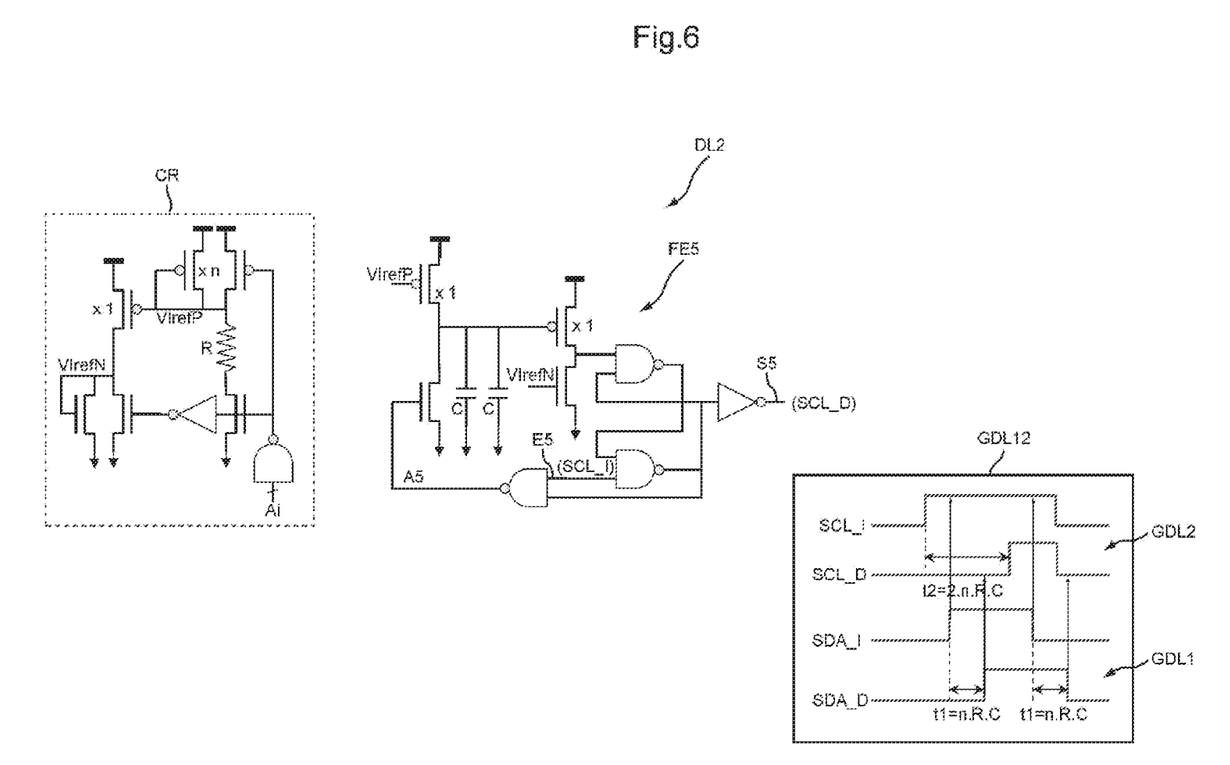

FIGS. 4, 5 and 6 show possible embodiments of, respectively, a low-pass stage PB, a first delay stage DL1, and a second delay stage DL2, for example intended to form together a device for processing an incoming clock signal SCL and an incoming data signal SDA transported over the bus, in a configuration of the type of the configuration previously described in relation to FIG. 2.

The low-pass stage PB comprises two elementary filtering modules FE1, FE2 configured in parallel, the first time delay stage DL1 comprises two elementary filtering modules FE3, FE4 configured in series, and the second time delay stage comprises an elementary filtering module FE5.

The elementary filtering modules FEi (e.g., i∈{1; 2; 3; 4; 5}) are of the type of the elementary filtering module FE described previously in relation to FIG. 3. Nevertheless, as described previously in relation to FIG. 2, a single resistive circuit CR is common to all the elementary filtering modules FE1-FE5, whereas each elementary filtering module comprises a respective dedicated capacitive circuit CC and buffer circuit CT.

In these embodiments, the resistive circuit CR comprises, in place of the second inverter INV2 in the configuration previously described in relation to FIG. 3, a NAND gate NDA receiving at the input all the control signals Ai from the various elementary filtering modules FEi.

The control signals Ai being referred to as enabled when they are at "0" and disabled when they are at "1," the NAND gate has an OR condition function on the enabled states of the control signals Ai (indeed, $\overline{Ai}+\overline{Aj}=\overline{Ai \cdot Aj}$).

Thus, each buffer circuit CT according to this embodiment is configured, in response to the first type of edge of the incident signal IN on the input E, for activating a respective control signal Ai, the resistive circuit CR being configured so that at least one enabled control signal Ai immediately controls the generation of the first current $i_r$.

Furthermore, the resistive circuit CR comprises an NMOS short-circuit transistor N5, configured for short-circuiting the gate of the NMOS transistor configured as a diode N2 to ground when no control signal Ai is enabled. Similarly, the resistive circuit CR comprises a PMOS short-circuit transistor P5, configured for short-circuiting the gate of the PMOS transistor configured as a diode P1 to the power supply voltage when no control signal Ai is enabled.

FIG. 4 shows an embodiment of a low-pass stage PB equipped with two elementary filtering modules FE1, FE2 configured in parallel, whose respective elementary outputs S1, S2 are respectively connected to inputs, respectively set and reset, of a latch FF of the non-inverted RS latch type, delivering an outgoing filtered signal OUT at the output.

The latch FF is configured for delivering an outgoing signal OUT at "1" when the set input St goes to "1," for delivering the outgoing signal OUT at "0" when the reset input Rst goes to "1," and for holding the outgoing signal OUT at the preceding value if the two inputs St, Rst are at "0."

The first elementary filtering module FE1 receives a first incident signal IN, and delivers a first outgoing signal on its elementary output S1, in which the positive pulses with a duration shorter than the elementary time period $t_{PB}$ of the first elementary filtering module FE1 have been filtered.

The second elementary filtering module FE2 receives a second incident signal INN, inverse of the first incident signal IN, and delivers a second outgoing signal on its elementary output S2, in which the positive pulses with a duration less than the elementary time period $t_{PB}$ of the second elementary filtering module FE2 have been filtered.

In other words, the first elementary filtering module FE1 delivers a first outgoing signal OUT1 corresponding to the first incident signal IN whose rising edges are delayed by the elementary time period $t_{PB}$, and whose positive pulses are filtered; whereas the second elementary filtering module FE2 delivers a second outgoing signal OUT2 corresponding to the inverse of the first incident signal IN whose falling edges are delayed by the elementary time period $t_{PB}$, and whose negative pulses are filtered.

Thus, as shown by the graph GPB of FIG. 4, the outgoing signal OUT at the output of the latch FF corresponds to the incident signal IN whose rising edges and falling edges are delayed by the elementary time period $t_{PB}$, and whose positive and negative pulses with a duration less than this time period $t_{PB}$ are filtered.

The elementary time period $t_{PB}$ corresponds to the time t0 described previously in relation to FIG. 3, i.e., $t_{PB}=nRC$. In any case, this time period can be adjusted by setting the capacitive value of the capacitive elements C of the elementary filtering modules FE1, FE2. This time period may also be adjusted by setting the size (k) of the transistors (in other words a number k of transistors of unitary size connected in parallel in order to form the transistor) P2, P3, P4, N2, N3 of the resistive circuit CR and of the elementary filtering modules FE1, FE2, in order to modify the size ratio (k/n) between the PMOS transistor configured as a diode P1 and the PMOS current copying transistors P2. The two elementary filtering modules FE1, FE2 must nevertheless support the same parameterization for delaying the rising and falling transitions by the same value, if needed.

Such a low-pass stage PB is notably intended to receive an incoming data signal SDA or an incoming clock signal SCL as incident signal IN so as to respectively supply a filtered data signal SDAf and a filtered clock signal SCLf.

In other words, and in the embodiment of the processing device previously described in relation to FIG. 2, a low-pass filtering stage PB comprises a first elementary filtering module FE1 and a second elementary filtering module FE2 configured in parallel. The elementary input IN of the first elementary filtering module FE1 is connected to the first input Ea of the device, the elementary input INN of the second elementary filtering module FE2 is coupled to the first input Ea via an inverter INV_IN. The low-pass filtering stage PB furthermore comprises a latch FF, having a set input St connected to the elementary output S1 of the first elementary filtering module FE1, a reset input Rst connected to the elementary output S2 of the second elementary filtering module FE2, and an output OUT_PB intended to deliver a filtered outgoing signal SCLf, SDAf having the first voltage level if the first voltage level is applied to the set input St and the second voltage level if the first voltage level is applied to the reset input Rst.

FIG. 5 shows an embodiment of a first delay stage DL1 designed to introduce a delay by a first time period t1 onto an incident signal SDA_I.

The first delay stage DL1 comprises a third elementary filtering module FE3 and a fourth elementary filtering module FE4 configured in series.

The third elementary filtering module FE3 receives an incident signal SDA_I on its elementary input E3, and delivers as output a third output signal on its output S3 corresponding to the incident signal SDA_I whose rising edges are delayed by the elementary time period t1, and whose falling edges are not delayed.

An inverter INVOUT3 makes the series link between the output S3 of the third elementary filtering module FE3 and the elementary input E4 of the fourth elementary filtering module FE4.

Thus, on the input E4 of the fourth elementary filtering module FE4, a rising edge of the incident signal SDA_I corresponds to a falling edge shifted by a time period t1, which is immediately transmitted to the output S4 of the fourth elementary filtering module FE4.

A falling edge of the incident signal SDA_I corresponds to a rising edge without delay on the input E4 of the fourth elementary filtering module FE4.

Thus, a falling edge of the incident signal SDA_I will be delayed by a time period t1 by the fourth elementary filtering module FE4, on the output S4 of the elementary filtering module FE4.

An output inverter INVOUT4 connected to the output S4 of the fourth elementary filtering module FE4 thus allows the outgoing signal SDA_D to be reconstructed, which corresponds to the incident signal SDA_I whose rising edges and falling edges are delayed by a time period t1.

As shown by the graph GDL1, the output SDA_D of the first delay stage DL1 corresponds to the incident signal SDA_I delayed by a time period t1.

The elementary time period t1 corresponds to the time period t0 previously described in relation to FIG. 3, i.e., t1=nRC. In any case, this time period can be adjusted by setting the capacitive value of the capacitive elements C of the elementary filtering modules FE3, FE4. This time delay can also be adjusted by setting the size (k) of the transistors (in other words a number k of transistors of unitary size connected in parallel in order to form the transistor) P2, P3, P4, N2, N3 of the resistive circuit CR and of the elementary filtering modules FE3, FE4, in order to modify the size ratio (k/n) between the PMOS transistor configured as a diode P1 and the PMOS current copying transistors P2.

The delays introduced by the third elementary filtering module FE3 and the fourth elementary filtering module FE4, respectively, may be different from one another.

In other words, and in the embodiment of the processing device previously described in relation to FIG. 2, a first delay stage DL1 comprises a third elementary filtering module FE3 and a fourth elementary filtering module FE4 configured in series. The elementary input E4 of the fourth elementary filtering module FE4 is coupled to the elementary output S3 of the third elementary filtering module FE3 via an inverter INVOUT3. The first delay stage DL1 comprises an inverter INVOUT4 connected to the output S of the fourth elementary filtering module FE4 and designed to deliver a delayed outgoing signal SDA_D.

Such a delay stage DL1 is notably intended to receive an incoming filtered data signal SDAf as incident signal SDA_I, and to operate in cooperation with a second delay stage DL2 configured for delaying an incoming filtered clock signal SCLf.

FIG. 6 shows an embodiment of a second delay stage DL2 designed to introduce a delay by a second time period t2 onto an incident signal SCL_I.

The second delay stage DL2 comprises a fifth elementary filtering module FE5, in which the capacitive element has a capacitive value equal to 2×C.

The fifth elementary filtering module FE5 receives an incident signal SCL_I on its input E5, and delivers a signal SCL_D at the output S5 corresponding to the incident signal SCL_I, whose rising edges are delayed by a time period t2=2nRC and whose falling edges are not delayed.

In any case, this time period t2 can be adjusted by setting the capacitive value of the capacitive element 2C of the fifth elementary filtering module FE5. This time period can also be adjusted by setting the size (k) of the transistor (in other words a number k of transistors of unitary size connected in parallel in order to form the transistor) P2, P3, P4, N2, N3 of the resistive circuit CR and of the elementary filtering module FE5 in order to parameterize the size ratio (k/n) between the PMOS transistor configured as a diode P1 and the PMOS current copying transistor P2. It will be seen hereinafter that the time period t2 is preferably parameterized to be equal to twice the time period t1 of the third filtering module of the first delay stage DL1.

As shown by the graph GDL12, the output SCL_D of the second delay stage corresponds to the input SCL_I for which only the rising edges are delayed by a time period t2 (GDL2), and the output SDA_D of the first delay stage DL1 corresponds to the incident signal SDA_I delayed by a time period t1 (GDL1).

In other words, and in the embodiment of the processing device previously described in relation to FIG. 2, a second delay stage DL2 comprises a fifth elementary filtering module FE5 whose time constant t2 is greater than the time constant t1 of the third elementary filtering module FE3, and is designed to deliver a delayed outgoing signal SCL_D.

Thus, the first delay stage DL1 and the second delay stage DL2 allow transitions of a data signal SDA_I, initially received during a high level of a clock signal SCL_I but close to the transitions of the clock signal SCL_I, to be seen outside of the high level of the outgoing clock signal SCL_D.

More precisely, the transitions of the data signal SDA_I occurring before a time $t_{SU}=t2-t1$ from a rising edge of the clock signal SCL_I, and the transitions of the data signal SDA_I occurring after a time $t_{SU}=t1$ before a falling edge of the clock signal SCL_I, are transferred onto the outgoing data signal SDA_D during low levels of the outgoing clock signal SCL_D.

This notably avoids this type of ambiguous transition from being treated as a start or end condition.

Generally speaking, a processing device DIS such as previously described in relation to FIG. 2, in which each elementary filtering module FEi is of the type of the elementary filtering module FE previously described in relation to FIG. 3 and for which a single resistive circuit CR is shared for all the elementary filtering modules FEi of the device DIS, exhibits a very stable behaviour, a reduced size, and an energy saving.

Indeed, given that only the rising edges are filtered in an elementary filtering module, no internal relative variation exists between the filtering of the rising and falling edges. Furthermore, notably because of the matching of the transistors of the elementary filtering modules, the elementary time periods $t_i$ do not depend on the power supply voltage Vdd, and are not therefore sensitive to variations of the power supply voltage Vdd.

Given that a single current source and a single resistive element are used for all the filters (the surface area occupied by the current mirror circuit being negligible compared with the footprint of a resistive element), and that, for a given time constant, the capacitive element can have a reduced size by virtue of the low value of the charge current ($i_c$) supplied by the current mirror circuit, the device occupies a greatly reduced space.

Since the elementary filtering modules only copy a fraction of the first current, the currents flowing in the capacitive circuits are greatly reduced, and given furthermore that the single current source is only activated where needed, the current consumption is accordingly minimized.

Furthermore, the invention is not limited to these embodiments but encompasses all their variants; for example other types of logic gates enabled by other logical values may be used to achieve the same effects, and similarly the resistive circuit may comprise other practical components which have not been discussed for the sake of concision, or again the general operation of this type of device may be adapted for purposes other than the application of the I²C specification previously introduced.

What is claimed is:

1. An electronic device comprising:
   a first input configured to receive an incoming digital signal;
   a plurality of elementary filtering modules coupled to the first input, wherein each filtering module of the plurality of elementary filtering modules comprises an elementary input configured to receive a corresponding incident elementary signal extracted from the incoming digital signal, a corresponding elementary output, and a dedicated capacitive circuit; and
   a resistive circuit coupled to each of the plurality of elementary filtering modules, wherein each elementary filtering module is configured to filter pulses of the corresponding incident elementary signal having a duration less than a time constant by using the dedicated capacitive circuit and the resistive circuit, and to deliver a filtered elementary signal at the corresponding elementary output.

2. The electronic device of claim 1, wherein:
   each elementary filtering module comprises a buffer circuit configured to generate a control signal when the incident elementary signal has a first voltage level;
   the resistive circuit comprises a resistive element and is configured to generate a first current in the resistive element when the control signal is enabled;
   a current mirror circuit is formed between the resistive circuit and the dedicated capacitive circuit of each elementary filtering module, the current mirror circuit configured to generate a second current based on the first current; and
   the dedicated capacitive circuit of each elementary filtering module comprises a capacitive element and is configured to charge the capacitive element with the second current.

3. The electronic device of claim 2, wherein the buffer circuit of each elementary filtering module is configured to deliver the filtered elementary signal at the first voltage level when a voltage across terminals of the capacitive element reaches a threshold value.

4. The electronic device of claim 3, wherein each dedicated capacitive circuit and corresponding current mirror circuit are configured so that the voltage across terminals of the capacitive element reach the threshold value in a time equal to the time constant.

5. The electronic device of claim 4, wherein the resistive circuit comprises a switching element configured to connect terminals of the resistive element to two nodes having a difference in potential equal to the threshold value to generate the first current when the control signal is enabled.

6. The electronic device of claim 5, wherein each buffer circuit comprises an inverter-trigger circuit having a trigger threshold, each buffer circuit being controlled by the voltage across terminals of the capacitive element and configured to control delivery of the filtered elementary signal.

7. The electronic device of claim 6, wherein the trigger threshold is equal to the threshold value.

8. The electronic device of claim 2, wherein each buffer circuit is configured to deliver the filtered elementary signal at a second voltage level when the incident elementary signal has the second voltage level.

9. The electronic device of claim 1, further comprising a low-pass filtering stage that comprises:
   a first elementary filtering module of the plurality of elementary filtering modules;
   a second elementary filtering module of the plurality of elementary filtering modules; and
   a latch having a set input coupled to the corresponding elementary output of the first elementary filtering module, a reset input coupled to the elementary output of the second elementary filtering module, and an output configured to deliver a filtered outgoing signal having a first voltage level when the first voltage level is applied to the set input and a second voltage level when the first voltage level is applied to the reset input.

10. The electronic device of claim 9, wherein the first and second elementary filtering modules are coupled in parallel, and wherein the elementary input of the first elementary filtering module is coupled to the first input, wherein the elementary input of the second elementary filtering module is coupled to the first input via an inverter.

11. The electronic device of claim 1, further comprising a first delay stage that comprises:

a third elementary filtering module of the plurality of elementary filtering modules;

a fourth elementary filtering module of the plurality of elementary filtering modules; and a second inverter, wherein the third and fourth elementary filtering modules are configured in series, the elementary input of the fourth elementary filtering module being coupled to the elementary output of the third elementary filtering module via a third inverter, and wherein the second inverter is coupled to the output of the fourth elementary filtering module and configured to deliver a delayed outgoing signal.

12. The electronic device of claim 11, further comprising a second delay stage that comprises a fifth elementary filtering module of the plurality of elementary filtering modules having a time constant that is greater than a time constant of the third elementary filtering module, wherein the fifth elementary filtering module is configured to deliver a delayed outgoing signal.

13. The electronic device of claim 1, further comprising a second input coupled to one of the plurality of elementary filtering modules and configured to receive another incoming digital signal.

14. The electronic device of claim 13, wherein the incoming digital signal corresponds to a clock signal of an inter-integrated circuit (I²C) bus and the another incoming digital signal corresponds to a data signal of the I²C bus.

15. An integrated circuit configured to communicate over inter-integrated circuit (I²C) bus, the integrated circuit comprising:

a data terminal configured to be coupled to an I²C data transmission channel and configured to receive a data signal;

a clock terminal configured to be coupled to an I²C clock transmission channel and configured to receive a clock signal; and a circuit that comprises:

a first input coupled to the clock terminal;

a second input coupled to the data terminal;

a plurality of elementary filtering modules coupled to the first input, wherein each filtering module of the plurality of elementary filtering modules comprises:

an elementary input configured to receive a corresponding incident elementary signal extracted from the data signal, a corresponding elementary output, and a dedicated capacitive circuit; and a resistive circuit coupled to each of the plurality of elementary filtering modules, wherein each elementary filtering module is configured to filter pulses of the corresponding incident elementary signal having a duration less than a time constant by using the dedicated capacitive circuit and the resistive circuit, and deliver a filtered elementary signal at the corresponding elementary output.

16. The integrated circuit of claim 15, wherein the integrated circuit is a non-volatile memory integrated circuit.

17. A method for filtering an incoming digital signal, the method comprising:

receiving an incoming signal at a first input;

receiving, with an elementary filtering module of a plurality of elementary filtering modules that are coupled to the first input, a corresponding incident elementary signal extracted from the incoming signal;

filtering pulses of the corresponding incident elementary signal having a duration less than a time constant to generate a filtered elementary signal by using a dedicated capacitive circuit of the elementary filtering module that cooperates with a resistive circuit coupled to each of the plurality of elementary filtering modules; and delivering the filtered elementary signal at an output of the elementary filtering module.

18. The method of claim 17, further comprising:

generating a control signal when the incident elementary signal has a first voltage level;

generating a first current in a resistive element of the elementary filtering module when the control signal is enabled;

generating a second current based on the first current by using a current mirror circuit formed between the resistive circuit and the dedicated capacitive circuit; and charging a capacitor of the dedicated capacitive circuit with the second current.

19. The method of claim 18, wherein delivering the filtered elementary signal comprises delivering the filtered elementary signal at the first voltage level when a voltage across terminals of the capacitor reaches a threshold value.

20. The method of claim 17, wherein the incoming signal corresponds to a clock signal of an inter-integrated circuit (I²C) bus, the method further comprising:

receiving a data signal of the I²C bus at a second input;

receiving, with a second elementary filtering module of a plurality of elementary filtering modules, a second corresponding incident elementary signal extracted from the data signal;

filtering pulses of the second corresponding incident elementary signal having a duration less than the time constant to generate a filtered data signal by using a dedicated capacitive circuit of the second elementary filtering module that cooperates with the resistive circuit; and delivering the filtered data signal at an output of the second elementary filtering module.

* * * * *